United States Patent [19]

Chang et al.

[11] Patent Number: 5,132,879
[45] Date of Patent: Jul. 21, 1992

[54] SECONDARY BOARD FOR MOUNTING OF COMPONENTS HAVING DIFFERING BONDING REQUIREMENTS

[75] Inventors: Cheng-Cheng Chang, Palo Alto; Lawrence R. Hanlon, Menlo Park, both of Calif.

[73] Assignee: Hewlett-Packard Company, Palo Alto, Calif.

[21] Appl. No.: 590,893

[22] Filed: Oct. 1, 1990

[51] Int. Cl.$^5$ ............................................. H05K 1/11
[52] U.S. Cl. ....................................... 361/412; 439/47
[58] Field of Search ............... 174/253, 255, 261, 262; 361/400, 412, 415, 421; 439/68, 69, 74, 75, 83; 357/69, 70, 80

[56] References Cited

U.S. PATENT DOCUMENTS

| | | | |
|---|---|---|---|
| 3,999,004 | 12/1976 | Chirino et al. | 174/255 |
| 4,368,503 | 1/1983 | Kurosawa et al. | 361/412 |
| 4,394,712 | 7/1983 | Anthony | 174/263 |
| 4,437,141 | 3/1984 | Prokop | 361/412 |
| 4,644,643 | 2/1987 | Sudo | 361/414 |
| 4,715,117 | 12/1987 | Enomoto | 29/846 |
| 4,803,450 | 2/1989 | Burgess et al. | 361/414 |
| 4,871,317 | 10/1989 | Jones | 439/68 |
| 4,887,544 | 12/1989 | Nunally | 427/97 |
| 4,902,237 | 2/1990 | Huetson | 439/83 |
| 5,006,922 | 4/1991 | McShane et al. | 361/400 |

FOREIGN PATENT DOCUMENTS

| | | | |
|---|---|---|---|
| 2345627 | 3/1975 | Fed. Rep. of Germany | 439/47 |
| 3316017 | 11/1984 | Fed. Rep. of Germany | 439/83 |

OTHER PUBLICATIONS

"The Condensed Chemical Dictionary" 8 Ed. by G. Hawley.

*Primary Examiner*—Leo P. Picard
*Assistant Examiner*—D. Sparks

[57] ABSTRACT

A system of interconnecting electrical components having conflicting bonding requirements for mounting the components to a printed circuit board. The system includes a primary printed circuit board having a pattern of through-holes and having arrangements of connection sites to receive electrical components. For example, the connection sites of the primary printed circuit board may be of the type to receive components associated with the bonding requirements of surface mounting. A secondary printed circuit board has a pattern of through-holes corresponding to the pattern of through-holes of the primary printed circuit board. The circuit boards are wave soldered or surface mounted together by means of the corresponding patterns of through-holes. Attached to the secondary printed circuit board is one or more electrical component having bonding requirements which conflict with those of the primary printed circuit board. Preferably, a tape automated bonding frame is in pressure contact with the through-holes of the secondary printed circuit board for electrical communication between the board via the through-holes.

15 Claims, 2 Drawing Sheets

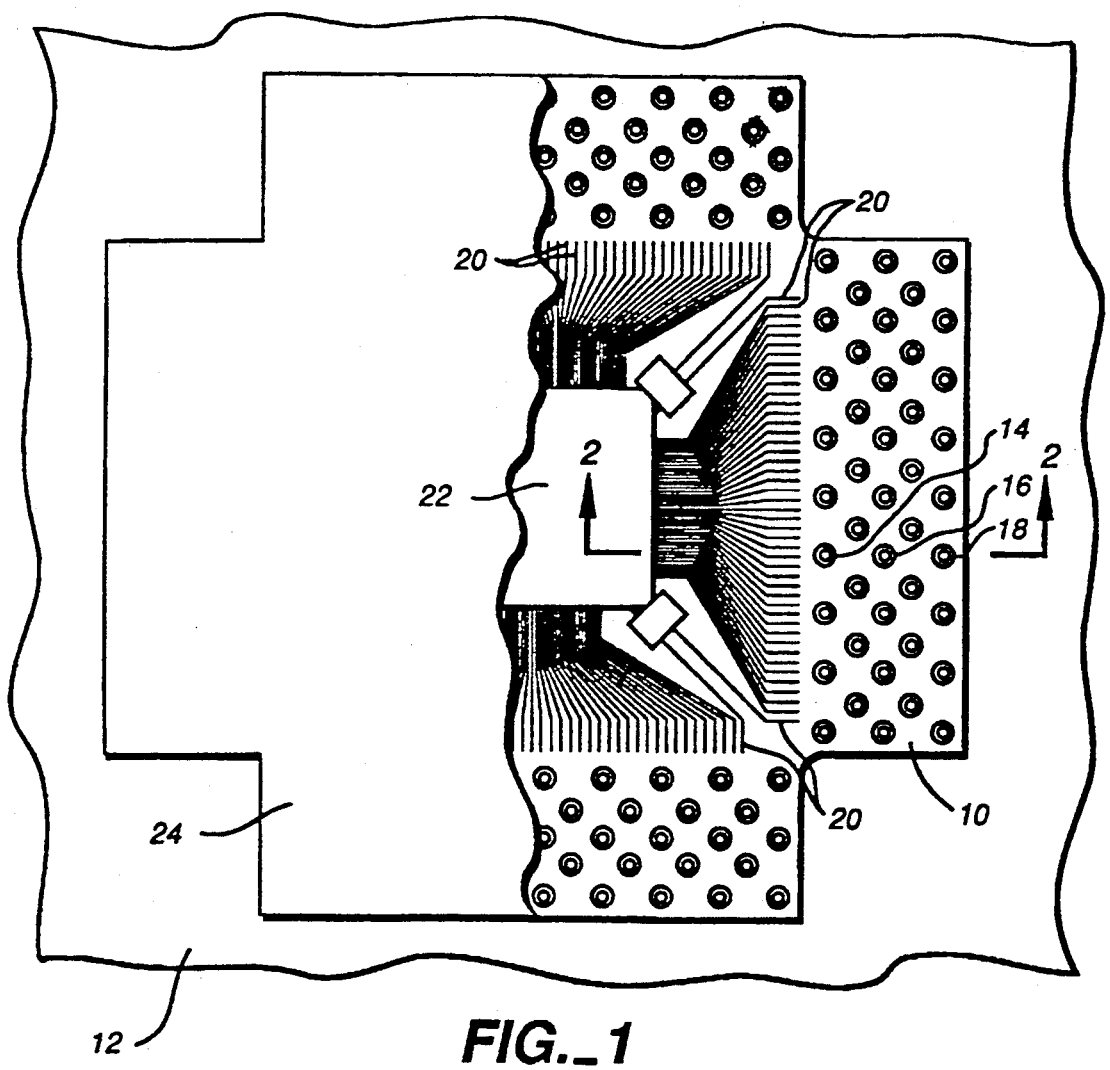
FIG._1
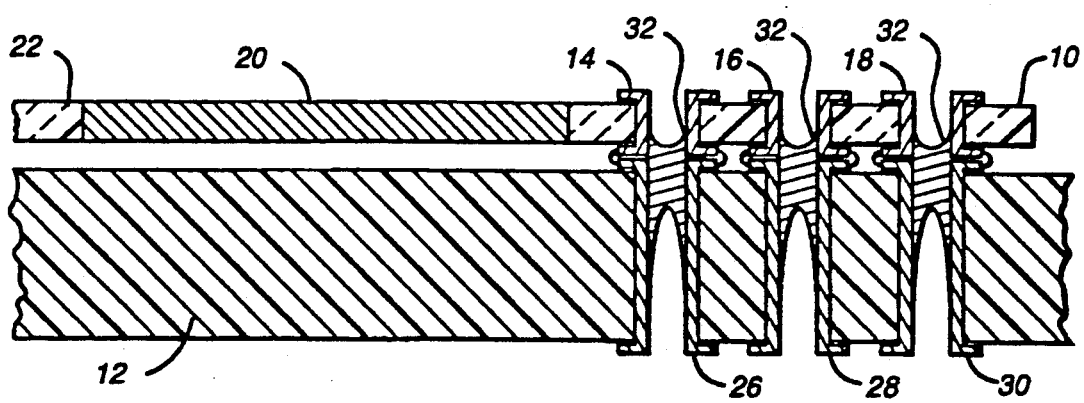
FIG._2

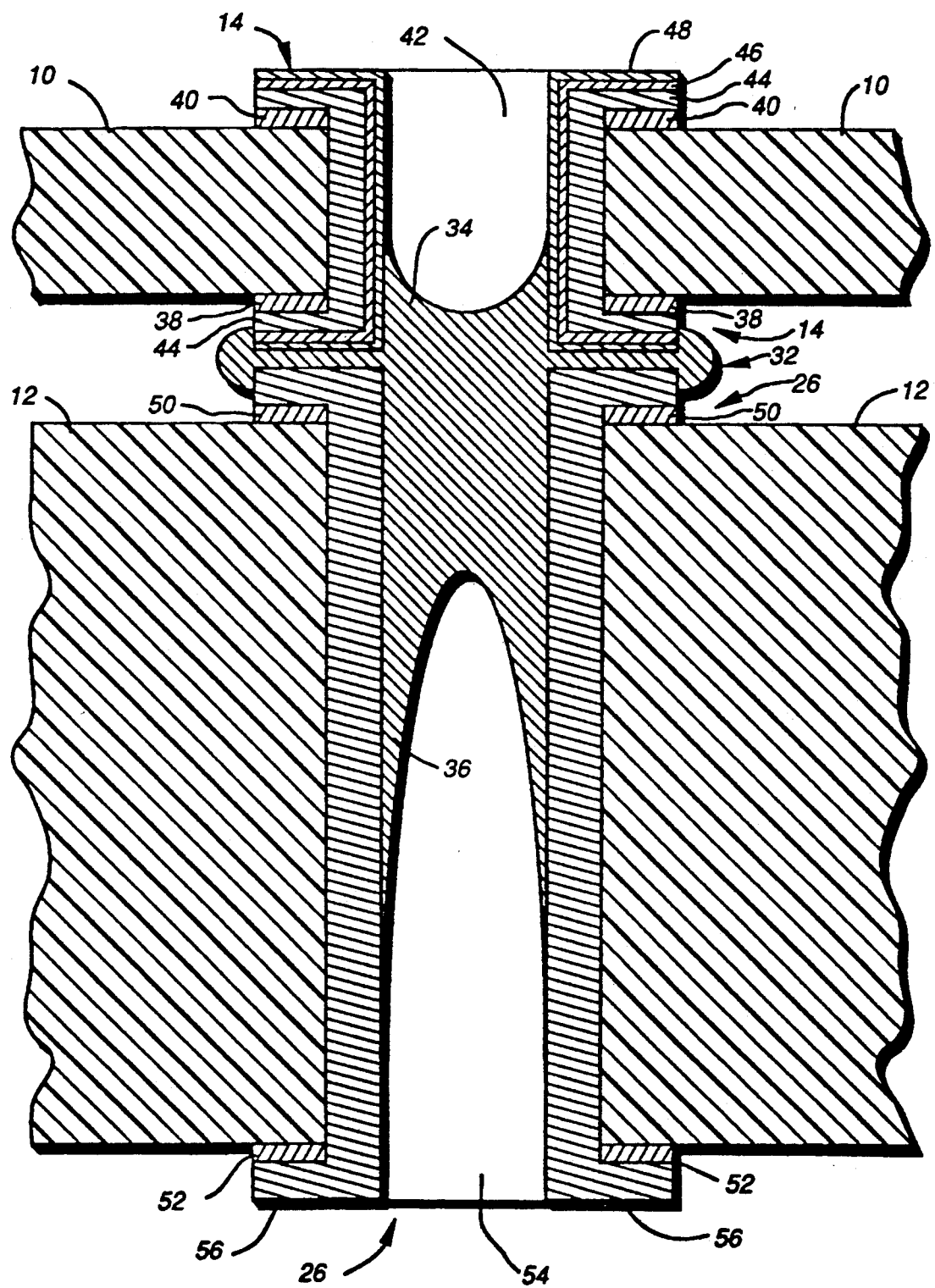
FIG._3

SECONDARY BOARD FOR MOUNTING OF COMPONENTS HAVING DIFFERING BONDING REQUIREMENTS

DESCRIPTION

1. Technical Field

The present invention relates to systems for connecting electrical components to printed circuit boards.

2. Background Art

In the assembly of electrical circuits, it is common to mount electrical components on a printed circuit board which is photolithographically patterned to include conductive traces for electrical connections among the components. The printed circuit board also includes conductive mounting pads arranged to provide patterns for receiving the electrical components. A printed circuit board may be designed to receive a variety of component types, and some component types may differ from other component types in terms of requirements for bonding to the printed circuit board.

One method of component bonding which is commonly used is known as surface mounting. In a surface mount process, a component is connected directly to the printed circuit board. The printed circuit board has circuit traces and mounting pads photolithographically printed on a surface of the circuit board. The surface mount component, such as a chip carrier, is then placed on the mounting pads and heat is applied to cause bonding. This bonding is typically provided by reflowing a solder paste or melting conductive material at the mounting pads and adding conductive material with a solder wave. Alternatively, some surface mount components are provided with a conductive adhesive which is utilized to both mechanically and electrically connect the components to the printed circuit board. While surface mounting technology is a convenient method, components bonded by this method are difficult to remove from the circuit board, as may be necessary when a component fails.

Another type of component is commonly referred to as a through-hole or feed-through component. Printed circuit board connection of this type of component is provided by soldering conductive legs of the component into through-holes, or vias, which extend completely through the printed circuit board. Through-hole components are generally more easily replaced than surface mounted components.

A third bonding technology, which is receiving increasing attention, involves tape automated bonding. This typically involves formation of a spider-like metal pattern of conductive fingers which radiate outwardly for connection to a printed circuit board. The pattern of fingers forms a lead frame having inner lead ends bonded to an integrated circuit chip. The fingers "fan out" to outer lead ends which are bonded to the printed circuit board. Thus, the lead frame, in effect, acts as a space transformer for the small integrated circuit chip to the larger printed circuit board.

While the above-described technologies are well established, problems with manufacturing and assembling electrical circuits exist. This is due in part to the fact that printed circuit boards are becoming increasingly complex. Often the bonding requirements of the different circuit elements, components and parts on a particular circuit board conflict. This can greatly affect the cost of manufacturing the circuit board. Indeed, the specific requirement of a circuit design for inclusion of a specific component may have a detrimental effect on the overall cost and yield of the printed circuit board.

Conflicting bonding requirements can lead to some extremely difficult choices for routine board manufacture. For example, a printed circuit board is typically solder coated by "hot air leveling" (HAL) across the entire board. Bonding is provided by reflowing the solder coating onto the component leads. A particular electrical component may, on the other hand, call for Cu/Ni/Au metallization on a group of mounting pads in a small localized area of the printed circuit board. Such a metallization requirement restricts the use of HAL. It is difficult to limit the use of HAL to only certain portions of a circuit board. Therefore, the bonding requirement of the one component for the Cu/Ni/Au metallization can render it impractical to use economical wholeboard processes such as HAL. Conflicting requirements therefore present a major problem in maintaining board cost, yield, capital investment and cycle time at target levels.

U.S. Pat. Nos. 4,902,237 to Huetson and 4,871,317 to Jones teach important, but limited, solutions to the problem. Huetson teaches an adapter for interfacing a surface mount component to a circuit board which was designed to receive a through-hole component. The patent also teaches an adaptor for the opposite application, i.e. bonding a through-hole component to a circuit board adapted to receive a surface mount component. The adaptors of Huetson permit repair of the printed circuit board when a component of one type is unavailable.

Jones also teaches an adaptor. The adaptor is used for prototyping electrical circuits. Prototype boards often call for through-hole connections. The adaptor of Jones includes through-pins which pass through the prototype vector boards and through contact openings in a surface mount adaptor element. The surface mount adaptor element includes an arrangement of solder pads which are used in surface mounting a component. In use, an adaptor element supports the through-pins and is sandwiched between the prototype vector board and the surface mount adaptor element to permit electrical communication between the components and the prototype vector board. Thus, the Jones patent teaches a temporary solution of sandwiching a passive element between two active boards.

It is an object of the present invention to provide a component interconnection system having broad application which allows whole-board bonding processes, while providing specialized component connections to the board.

SUMMARY OF THE INVENTION

The above object has been met by directly coupling primary and secondary printed circuit boards, with each printed circuit board having components associated with bonding requirements which conflict with bonding requirements of components on the other circuit board. The primary and secondary printed circuit boards are directly mounted to each other by means of through-holes in the secondary circuit board and connection sites on the primary circuit board. Preferably, the connection sites of the primary circuit board are through-holes having a pattern corresponding to the pattern of through-holes on the secondary circuit board.

A preferred embodiment is one in which the primary printed circuit board is adapted to receive through-hole components and the secondary printed circuit board is one in which an integrated circuit chip is mounted to the secondary board by a tape automated bonding frame. Inner leads of the frame connect to the input/output pads of the chip, while outer leads of the frame are in electrical communication with the through-holes of the secondary board. The "outer lead bonding" of the frame to the through-holes may be by means of solderless pressure contact. That is, electrical communication may be provided by a compression cap which exerts a compression force of a signal trace onto a second signal trace or a through-hole. To ensure proper electrical communication upon pressure contact, a metallization of Cu/Ni/Au is provided.

An advantage of the present invention is that the complexity of a particular printed circuit board is reduced. The special requirements of particular components, such as a pressure-contact tape automated bonding frame, do not affect the primary printed circuit board. Limiting a metallization of Cu/Ni/Au to only those connection sites within certain localized regions of a primary circuit board would significantly add to the manufacturing cost and complexity. On the other hand, providing such a metallization to the entirety of the board would adversely affect the reliability of the board since the gold coating, which increases reliability of pressure connections, decreases the reliability of solder connections. The present invention eliminates this choice between cost and complexity on the one hand and reliability on the other.

BRIEF DESCRIPTION OF THE DRAWINGS

FIG. 1 is a top, partially cutaway view of a secondary printed circuit board connected to a primary circuit board in accord with the present invention.

FIG. 2 is a side sectional view of the primary and secondary boards of FIG. 1, taken along line 2—2.

FIG. 3 is a side sectional view of a through-hole to through-hole solder connection of FIG. 2.

BEST MODE FOR CARRYING OUT THE INVENTION

With reference to FIGS. 1 and 2, a secondary printed circuit board 10 is shown as being mounted to a primary circuit board 12. The secondary printed circuit board includes a pattern of through-holes, three of which 14, 16 and 18 are shown in FIG. 2. The through-holes penetrate the board from a top surface to a bottom surface, in a manner known in the art of printed circuit board manufacture.

Mounted in the center of the secondary printed circuit board 10 is a tape automated bonding frame having conductive leads 20 which attach at inner ends to an integrated circuit chip 22. The conductive leads 20 are typically made of copper and fanout at outer lead ends to provide a greater spacing between adjacent conductive leads for attachment to the secondary printed circuit board 10. The total number of conductive leads is dependent upon the number of input/output pads of the integrated circuit chip 22. It is possible to limit the spacing between adjacent conductive leads to a distance of 4 mils. Such fine pitch tape automated bonding allows relative ease of attachment of 408 leads to the input/output pads of the integrated circuit chip 22.

FIG. 1 shows the conductive leads 20 which comprise the tape automated bonding frame as being spaced apart from the through-holes 14-18. Typically, the tape automated bonding frame is formed by photolithographically etching solid copper to obtain the desired pattern of conductive leads 20. Thus, rather than the spacing between the conductive leads and through-holes, it is possible to etch the copper so that the conductive leads contact the through-holes. Here however, electrical communication between the through-holes and the conductive leads, and therefore the integrated circuit chip 22, is provided by a solderless pressure bonding method. A cap 24 is clamped to the secondary printed board 10. On the underside of the cap 24, not shown, is a pattern of conductive traces which have inner ends that match the pattern of the conductive leads and have outer ends which match the pattern of the through-holes. The conductive traces of the cap 24 permit the inputting and outputting of signals to and from the secondary printed circuit board whenever the cap 24 is fastened in place.

As described above, electrical communication between the conductive leads 20 and the through-holes 14-18 can be by means of the conductive traces on the underside of the cap 24 or by extending the conductive traces 20 during formation of the tape automated bonding frame so that the conductive leads are afterward soldered to the through-holes. A third alternative is to extend the conductive leads during formation of the tape automated bonding frame, but to use compression force rather than solder to bond the extended conductive leads to the through-holes. In this third alternative, the cap 24 does not include conductive traces, but continues to provide the compression force for ensuring proper contact. This function of the cap is the same for a fourth alternative in which the secondary printed circuit board 10 includes the traces necessary to electrically connect the conductive leads 20 and the through-holes 14-18. The traces may be on the top surface of the board 20 or may be within some other layer of the board. Likewise, in this fourth alternative, the board traces may be soldered to the conductive leads 20 and in pressure contact with the through-holes 14-18, or the arrangement of solder and pressure contacts can be reversed.

Referring now to FIGS. 2 and 3, the secondary printed circuit board 10 is directly mounted to the primary circuit board 12. The primary board includes an array of connection sites, which are shown here as through-holes 26, 28 and 30. The pattern of the through-holes 26-30 of the primary board matches the pattern of the through-holes 14-18 of the secondary board. In connecting the two circuit boards 10 and 12, the patterns are aligned prior to mounting. Heat is then provided to cause reflowing of solder to obtain the solder connection best seen in FIG. 3. The solder connection 32 includes material which flows between the through-hole 14 of the secondary board and the through-hole 26 of the primary board. The solder material 34 and 36 also flows into the through-holes 14 and 26. The shape of the material in the through-holes is dependent upon the forces of gravity and surface adhesion and tension along the walls of the through-holes.

While there may be advantages to surface mounting the secondary printed circuit board 10 to the primary printed circuit board 12, it is more cost-efficient to use a wave soldering technique. Wave soldering is well known in the art, and may be used to mount the secondary printed circuit board to the one side of the primary board. A mask should be utilized to protect the contact areas of the upper surface during wave soldering.

The primary printed circuit board 12 includes electrical elements, such as connectors, resistors, integrated circuit chip packages, and the like. Preferably, each of the electrical elements on the primary printed circuit board 12 matches the other elements on the board with respect to bonding requirements. Bonding requirements include requirements as to the materials and structure and the method for ensuring the proper bond of an element to the board. For example, in FIG. 1 an electrical element 37 having leads 39 is surface mounted to connection sites 41 on the primary printed circuit board 12 by the application of heat to cause a reflow of solder at the interface of the leads and the connection sites.

On the other hand, the electrical elements on the secondary printed circuit board 10 have bonding requirements which conflict with the bonding requirements of the primary board 12. As shown in FIG. 1, here the bonding requirements are those associated with tape automated bonding, and preferably pressure contact tape automated bonding. To ensure proper contact upon the application of compression force to the conductive leads 20 and the through-holes 14, 16 and 18, certain requirements are made of the construction and the materials used. Referring again to FIG. 3, in constructing a through-hole 14 for pressure contact tape automated bonding, copper foils 38 and 40 are attached to the opposed major surfaces of the secondary printed circuit board 10 encircling a hole 42 through the board. A layer of copper 44 is applied to cover the foils 38 and 40 and to line the hole 42. Nickel 46 is used to plate the copper 44. Atop the plating of nickel is a layer of gold 48. The layer of gold provides a highly conductive surface for pressure contact with a conductive trace which preferably is also covered with gold at its contact point.

It would be possible to provide the sequential layers of copper, nickel and gold to those through-holes of the primary printed circuit board 12 which would make contact with a lead of a tape automated bonding frame, while using standard metallization for the remaining through-holes of the primary board. However, to segregate metallization on the primary circuit board would add to the complexity and cost of manufacturing the board. Alternatively, it would be possible to manufacture the primary circuit board so that all through-holes have the copper, nickel and gold metallization, without regard to which through-holes will be in contact with pressure-contact tape automated bonding conductive leads and which through-holes will be soldered to an electrical element. However, the gold coating may affect the reliability of solder connections. Thus, use of the secondary printed circuit board 10 reduces the complexity and cost of manufacture and increases the reliability of a printed circuit board which is associated with pressure-contact tape automated bonding.

The through-hole 26 of the primary circuit board is structured in a more conventional manner. The opposed major surfaces of the primary board 12 each have a copper foil 50 and 52 about a hole 54 through the board. The foils 50 and 52 and the hole 54 are plated with a single layer 56 of material. The plating material 56 may be copper, but the plating is not critical to the present invention. As noted above, wave solder technology or surface mount technology is then employed to form the solder connections 32 that permit electrical communication between the primary printed circuit board 12 and the secondary printed circuit board 10.

We claim:

1. A system of interconnecting electrical elements having differing bonding requirements for mounting said elements to a printed circuit board, said system comprising, a primary printed circuit board having first means for bonding electrical elements thereto, said first bonding means being associated with first bonding requirements, said primary printed circuit board further having a first pattern of through-holes penetrating therethrough, a secondary printed circuit board having a second pattern of through-holes corresponding to said first pattern, said secondary printed circuit board being directly mounted to said primary printed circuit board by solder connections of said first pattern to said second pattern of through-holes, said secondary printed circuit board having second means for bonding electrical elements, said second bonding means being associated with second bonding requirements different from said first bonding requirements, and an integrated circuit chip, said second means for bonding electrical elements including a tape automated bonding frame having inner leads mounted to said integrated circuit chip and having outer leads in electrical connection with said second pattern of through-holes of said secondary printed circuit board.

2. The system of claim 1 wherein said second bonding means further includes a pressure contact member for exerting compression force on said outer leads and on said second pattern of through-holes so as to provide electrical connection therebetween.

3. The system of claim 1 wherein said second bonding means is associated with the bonding requirement of plating said second pattern of through-holes with gold, said bonding requirement being different from the bonding requirements of said first bonding means.

4. The system of claim 1 wherein said primary and secondary printed circuit boards are generally flat members parallel to each other.

5. A system of interconnecting electrical elements having differing bonding requirements for mounting said elements to a printed circuit board comprising, a primary printed circuit board having a pattern of surface connection sites and having first means for bonding electrical elements to said primary printed circuit board, said first bonding means having first bonding requirements for electrical communication between said electrical elements and said primary printed circuit board, and a secondary printed circuit board having a pattern of through-holes in direct solder connection with said surface connection sites of said primary printed circuit board, said primary printed circuit board having a surface area substantially greater than said secondary printed board, said second printed circuit board having a tape automated bonding means for mounting electrical elements to said secondary printed circuit board, said tape automated bonding means having a plurality of conductive leads in electrical communication with said through-holes for inputting and outputting signals to said primary printed circuit board via said through-holes.

6. The system of claim 7 wherein said surface connection sites of said primary printed circuit board are through-holes penetrating said primary printed circuit board and surface mounted to said through-holes of said secondary printed circuit board.

7. The system of claim 7 wherein said tape automated bonding means includes a cap member fastened to said secondary printed circuit board to exert a compression force at said conductive leads to provide a solderless pressure connection for electrically connecting said conductive leads and said through-holes.

8. The system of claim 7 wherein said tape automated bonding means is associated with a bonding requirement of gold plating said through-holes.

9. The system of claim 7 wherein said primary and secondary printed circuit boards are generally flat and are parallel to each other.

10. The system of claim 7 wherein said first bonding means includes a plurality of connection sites disposed for the surface mounting of electrical elements.

11. A system of interconnecting electrical components having differing bonding requirements for mounting said components to a printed circuit board comprising, primary and secondary printed circuit boards having corresponding patterns of through-holes therein, said primary and secondary boards being mounted to each other by attachment of said corresponding patterns of through-holes, said primary board having a first electrical component of a type having first bonding requirements for electrical connection to said primary board, said secondary board having a second electrical component of a type having second bonding requirements conflicting with said bonding requirements.

12. The system of claim 11 wherein said second electrical component includes a tape automated bonding frame, said frame defining said second bonding requirements.

13. The system of claim 12 wherein said frame is electrically connected to said through-holes of said secondary board.

14. The system of claim 13 wherein said through-holes of said secondary board are gold plated.

15. The system of claim 11 wherein said primary and secondary boards are parallel, generally flat printed circuit boards.

* * * * *